United States Patent
Boisvert et al.

(10) Patent No.: US 7,989,030 B2
(45) Date of Patent: Aug. 2, 2011

(54) SILICONE RESIN AND SILICONE COMPOSITION

(75) Inventors: Ronald Boisvert, Chandler, AZ (US); Duane Bujalski, Auburn, MI (US); Zhongtao Li, Midland, MI (US); Kai Su, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 428 days.

(21) Appl. No.: 12/375,436

(22) PCT Filed: Jul. 23, 2007

(86) PCT No.: PCT/US2007/016522
§ 371 (c)(1),
(2), (4) Date: Jan. 28, 2009

(87) PCT Pub. No.: WO2008/018981
PCT Pub. Date: Feb. 14, 2008

(65) Prior Publication Data
US 2009/0226609 A1    Sep. 10, 2009

Related U.S. Application Data

(60) Provisional application No. 60/835,656, filed on Aug. 4, 2006.

(51) Int. Cl.
*B05D 3/02*    (2006.01)
*C08G 77/02*    (2006.01)

(52) U.S. Cl. ............ 427/387; 528/31; 528/39; 528/394; 528/395; 528/481

(58) Field of Classification Search .................. None
See application file for complete search history.

(56) References Cited

U.S. PATENT DOCUMENTS

| | | |
|---|---|---|
| 3,615,272 A | 10/1971 | Collins et al. |
| 4,999,397 A | 3/1991 | Weiss et al. |
| 5,010,159 A | 4/1991 | Bank et al. |
| 5,063,267 A | 11/1991 | Hanneman et al. |
| 5,318,618 A * | 6/1994 | Inoue et al. ............. 106/287.16 |
| 5,446,088 A | 8/1995 | Haluska |
| 2003/0064254 A1* | 4/2003 | Eguchi et al. ................ 428/698 |

FOREIGN PATENT DOCUMENTS

WO    WO 2005/028101    *    3/2005

OTHER PUBLICATIONS

Derwent abstract for WO 2005/028101.*
JP 11-158435, Jun. 15, 1999, Chugoku Marine Paints Ltd.—Abstract only.
JP 59-178749, Oct. 11, 1984, Fujitsu Ltd.—Abstract only.
JP 60-086017, May 15, 1985, Fujitsu Ltd.—Abstract only.
JP 63-107122, May 12, 1988, Fujitsu Ltd.—Abstract only.
Kasgoz, et. al., "Sol-gel preparation of borosilicates", Journal of Non-Crystalline Solids, 1999, pp. 168-174, vol. 243.
Soraru, et. al., "Organically Modified SiO-BO Gels Displaying a High Content of Borosiloxane (=B-O-Si#) Bonds", Chemistry of Materials, 1999, pp. 910-919, vol. 11.

* cited by examiner

*Primary Examiner* — Marc Zimmer
(74) *Attorney, Agent, or Firm* — Larry A. Milco

(57) ABSTRACT

A silicone resin containing boron, aluminum, and/or titanium, and having silicon-bonded branched alkoxy groups; a silicone composition containing a silicone resin; and a method of preparing a coated substrate comprising applying a silicone composition on a substrate to form a film and pyrolyzing the silicone resin of the film.

10 Claims, No Drawings

SILICONE RESIN AND SILICONE COMPOSITION

CROSS REFERENCE TO RELATED APPLICATIONS

This application is a U.S. national stage filing under 35 U.S.C. §371 of PCT Application No. PCT/US2007/016522 filed on 23 Jul. 2007, currently pending, which claims the benefit of U.S. Provisional Patent Application No. 60/835,656 filed 4 Aug. 2006 under 35 U.S.C. §119 (e). PCT Application No. PCT/US2007/016522 and U.S. Provisional Patent Application No. 60/835,656 are hereby incorporated by reference.

FIELD OF THE INVENTION

The present invention relates to a silicone resin and more particularly to a silicone resin containing boron, aluminum, and/or titanium, and having silicon-bonded branched alkoxy groups. The present invention also relates to a silicone composition containing a silicone resin, and to a method of preparing a coated substrate comprising applying a silicone composition on a substrate to form a film and pyrolyzing the silicone resin of the film.

BACKGROUND OF THE INVENTION

Silicone polymers containing boron are known in the art. For example, Kasgoz et al. (J. Non-Cryst. Solids 1999, 243 (2,3), 168-174) report the synthesis of polyborosiloxanes, as a precursor for borosilicate gel plates and fibers, by the reaction of silicic acid and boron tri-n-butoxide followed by alkoxylation with 1-butanol.

Kasgoz et al. (J. Mater. Sci. 1999, 34(24), 6137-6141) describe the preparation and properties of gels via borosiloxane polymers formed by the reaction of tetracetoxysilane with boron tri-n-butoxide in tetrahydrofuran.

Kasgoz et al. (J. Polym. Sci., Part A: Polym. Chem. 1994, 32 (6), 1049-1056) report the formation of $SiO_2$—$B_2O_3$ gel fibers and oxides by the sol-gel method using $(AcO)_4Si$ and $(BuO)_3B$.

Kasgoz et al. (Nippon Seramikkusu Kyokai Gakujutsu Ronbunshi 1989, 97 (11), 1432-1434) report the preparation of polyborosiloxane as a precursor for borsilicate fibers.

Soraru et al. (Chem. Mater. 1999, 11(4), 910-919) report the synthesis of hybrid $SiO_2$—$B_2O_3$ gels by cohydrolysis of modified silicone alkoxides [$RSi(OEt)_3$, R=Me, Vi or Et] and $B(OEt)_3$.

Japanese Patent Publication No. 04-359056 to Kobayashi et al. discloses a resin composition obtained by adding a silica sol to a resin solution of an organosilicon polymer expressed by the formula $(SiO_4)_l(PO_{5/2})_m(BO_{3/2})_n$, where l, m, and n are $(99-40)/(0.5-30)/(0.5-30)$ and the polymer has an average molecular weight of 500-30,000.

Although the aforementioned references disclose silicone polymers containing boron, they do not disclose the silicone resin of the present invention containing boron, aluminum, and/or titanium, and having silicon-bonded branched alkoxy groups.

BRIEF SUMMARY OF THE INVENTION

The present invention is directed to a silicone resin having the formula:

$$(EO_{s/2})_t(HSiO_{3/2})_v((R^1O)_3SiO_{1/2})_w((R^1O)_2SiO_{2/2})_x(R^1OSiO_{3/2})_y(SiO_{4/2})_z \quad (I),$$

wherein each E is independently an atom selected from B, Al, and Ti; $R^1$ is $C_1$ to $C_{10}$ branched alkyl; s=3 when E is B or Al, or s=4 when E is Ti; t is from 0.01 to 0.8; v is from 0 to 0.99; w is from 0 to 0.99; x is from 0 to 0.99; y is from 0 to 0.99; z is from 0 to 0.8; w+x+y=0.01 to 0.99; and t+v+w+x+y+z=1.

The present invention is also directed to a silicone composition comprising the aforementioned silicone resin and an organic solvent.

The present invention is further directed to a method of preparing a coated substrate, the method comprising (i) applying a silicone composition on a substrate to form a film, wherein the silicone composition comprises a silicone resin having the formula (I), and an organic solvent; and (ii) pyrolyzing the silicone resin of the film.

The silicone resin of the present invention is soluble in a variety of organic solvents and is substantially free of gel. Moreover, the silicone resin can be pyrolyzed to produce silicate coatings exhibiting good adhesion to a variety of substrates.

The silicone composition of the present invention can be conveniently formulated as a one-part composition having good shelf-stability. Moreover, the composition can be applied on a substrate by conventional high-speed methods such as spin coating, dip-coating, printing, and spraying.

The method of preparing the coated substrate can be carried out using conventional equipment and techniques. Also, the method can be scaled to a commercial manufacturing process.

The silicone resin of the present invention can be used to prepare protective or dielectric coatings that are useful in a variety of consumer devices, including semiconductor devices, liquid crystals, light-emitting diodes, organic light-emitting diodes, optoelectronic devices, optical devices, photovoltaic cells, thin film batteries, and solar cells.

DETAILED DESCRIPTION OF THE INVENTION

As used herein the term "branched alkyl" refers to an alkyl group wherein the carbon atom bearing the free valence is attached to each of two or three other carbon atoms. Also, the term "branched alkoxy group" refers to an alkoxy group wherein the oxygen atom bearing the free valence is attached to a branched alkyl group. Further, the notation $EO_{s/2}$, wherein E is B or Al, and s=3, denotes units having the following formulae:

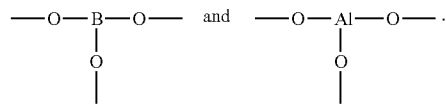

Further, the notation $EO_{s/2}$, wherein E is Ti and s=4, denotes a unit having the formula:

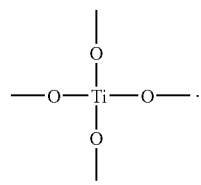

A silicone resin according to the present invention has the formula:

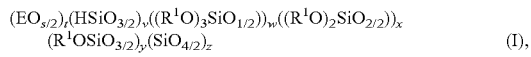

$$(EO_{s/2})_t(HSiO_{3/2})_v((R^1O)_3SiO_{1/2})_w((R^1O)_2SiO_{2/2})_x$$
$$(R^1OSiO_{3/2})_y(SiO_{4/2})_z \qquad (I),$$

wherein each E is independently an atom selected from B, Al, and Ti; $R^1$ is $C_1$ to $C_{10}$ branched alkyl; s=3 when E is B or Al, or s=4 when E is Ti; t is from 0.01 to 0.8; v is from 0 to 0.99; w is from 0 to 0.99; x is from 0 to 0.99; y is from 0 to 0.99; z is from 0 to 0.8; w+x+y=0.01 to 0.99; and t+v+w+x+y+z=1.

The branched alkyl groups represented by $R^1$ typically have from 1 to 10 carbon atoms, alternatively from 1 to 6 carbon atoms, alternatively from 1 to 4 carbon atoms. Examples of branched alkyl groups include, but are not limited to, 1-methylethyl (iso-propyl), 1-methylpropyl (sec-butyl), 1,1-dimethylethyl (tert-butyl), 1-methylbutyl, 1-ethylpropyl, 1,2-dimethylpropyl, 1-methylpentyl, 1-methylhexyl, 1-methylheptyl, 1-methyloctyl, and 1-methylnonyl.

In the formula (I) of the silicone resin, the subscripts t, v, W, X, y, and z are mole fractions. The subscript t typically has a value of from 0.01 to 0.8, alternatively from 0.02 to 0.6, alternatively from 0.05 to 0.4; the subscript v typically has a value of from 0 to 0.99, alternatively from 0.005 to 0.8, alternatively from 0.01 to 0.7; the subscript w typically has a value of from 0 to 0.99, alternatively from 0.02 to 0.5, alternatively from 0.05 to 0.2; the subscript x typically has a value of from 0 to 0.99, alternatively from 0.005 to 0.8, alternatively from 0.01 to 0.7; the subscript y typically has a value of from 0 to 0.99, alternatively from 0.02 to 0.8, alternatively from 0.05 to 0.7; the subscript z typically has a value of from 0 to 0.8, alternatively from 0.02 to 0.7, alternatively from 0.05 to 0.6; and the sum w+x+y typically has a value of from 0.01 to 0.99, alternatively from 0.15 to 0.90, alternatively from 0.3 to 0.8.

The silicone resin typically has a weight-average molecular weight of from 500 to 150,000, alternatively from 1000 to 50,000, alternatively from 3000 to 25,000, wherein the molecular weight is determined by gel permeation chromatography using a refractive index detector and polystyrene standards.

The silicone resin typically contains from 10 to 110 mol %, alternatively from 20 to 105 mol %, alternatively from 40 to 100 mol %, of silicon-bonded hydroxy groups, based on the total number of moles of silicon atoms in the resin, as determined by $^{29}$Si NMR.

Examples of silicone resins include, but are not limited to, resins having the following formulae: $(BO_{3/2})_{0.3}(\text{iso-PrO-}SiO_{3/2})_{0.7}$, $(BO_{3/2})_{0.3}(\text{sec-BuO}SiO_{3/2})_{0.7}$, $(BO_{3/2})_{0.3}(\text{tert-BuO}SiO_{3/2})_{0.7}$, $(BO_{3/2})_{0.1}(HSiO_{3/2})_{0.3}(\text{iso-PrO}SiO_{3/2})_{0.6}$, $(BO_{3/2})_{0.1}(HSiO_{3/2})_{0.3}((\text{iso-PrO})_2SiO_{2/2})_{0.6}$, $(BO_{3/2})_{0.1}(HSiO_{3/2})_{0.3}(\text{tert-BuO}SiO_{3/2})_{0.6}$, $(BO_{3/2})_{0.1}(HSiO_{3/2})_{0.3}((\text{sec-BuO})_2SiO_{2/2})_{0.6}$, $(AlO_{3/2})_{0.3}(\text{iso-PrO}SiO_{3/2})_{0.7}$, $(AlO_{3/2})_{0.3}(\text{sec-BuO}SiO_{3/2})_{0.7}$, $(AlO_{3/2})_{0.3}(\text{tert-BuO}SiO_{3/2})_{0.7}$, $(AlO_{3/2})_{0.1}(SiO_{3/2})_{0.3}(\text{iso-PrO}SiO_{3/2})_{0.6}$, $(AlO_{3/2})_{0.1}(HSiO_{3/2})_{0.3}((\text{iso-PrO})_2SiO_{2/2})_{0.6}$, $(AlO_{3/2})_{0.1}(HSiO_{3/2})_{0.3}(\text{tert-BuO}SiO_{3/2})_{0.6}$, $(AlO_{3/2})_{0.1}(HSiO_{3/2})_{0.3}((\text{sec-BuO})_2SiO_{2/2})_{0.6}$, $(TiO_{4/2})_{0.3}(\text{iso-PrO}SiO_{3/2})_{0.7}$, $(TiO_{4/2})_{0.3}(\text{sec-BuO}SiO_{3/2})_{0.7}$, $(TiO_{4/2})_{0.3}(\text{tert-BuO}SiO_{3/2})_{0.7}$, $(TiO_{4/2})_{0.1}(HSiO_{3/2})_{0.3}(\text{iso-PrO}SiO_{3/2})_{0.6}$, $(TiO_{4/2})_{0.1}(HSiO_{3/2})_{0.3}((\text{iso-PrO})_2SiO_{2/2})_{0.6}$, $(TiO_{4/2})_{0.1}(HSiO_{3/2})_{0.3}(\text{sec-BuO}SiO_{3/2})_{0.6}$, $(TiO_{4/2})_{0.1}(HSiO_{3/2})_{0.3}((\text{tert-BuO})_2SiO_{2/2})_{0.6}$, $(BO_{3/2})_{0.15}(AlO_{3/2})_{0.15}(\text{iso-PrO}SiO_{3/2})_{0.7}$, $(BO_{3/2})_{0.15}(AlO_{3/2})_{0.15}(\text{sec-BuO}SiO_{3/2})_{0.7}$, $(BO_{3/2})_{0.15}(AlO_{3/2})_{0.15}(\text{tert-BuO}SiO_{3/2})_{0.7}$, $(BO_{3/2})_{0.05}(AlO_{3/2})_{0.05}(HSiO_{3/2})_{0.3}(\text{iso-PrO}SiO_{3/2})_{0.6}$, $(BO_{3/2})_{0.05}(AlO_{3/2})_{0.05}(HSiO_{3/2})_{0.3}(\text{sec-BuO}SiO_{3/2})_{0.6}$, $(BO_{3/2})_{0.05}(AlO_{3/2})_{0.05}(HSiO_{3/2})_{0.3}((\text{tert-BuO})_2SiO_{2/2})_{0.6}$, $(BO_{3/2})_{0.05}((AlO_{3/2})_{0.05}(HSiO_{3/2})_{0.3}((\text{iso-PrO})_2SiO_{2/2})_{0.6}$, $(BO_{3/2})_{0.15}(TiO_{4/2})_{0.15}(\text{iso-PrO}SiO_{3/2})_{0.7}$, $(BO_{3/2})_{0.15}(TiO_{4/2})_{0.15}(\text{sec-BuO}SiO_{3/2})_{0.7}$, $(BO_{3/2})_{0.15}(TiO_{4/2})_{0.15}(\text{tert-BuO}SiO_{3/2})_{0.7}$, $(BO_{3/2})_{0.05}(TiO_{4/2})_{0.05}(HSiO_{3/2})_{0.3}(\text{iso-PrO}SiO_{3/2})_{0.6}$, $(BO_{3/2})_{0.05}(TiO_{4/2})_{0.15}(HSiO_{3/2})_{0.3}(\text{sec-BuO}SiO_{3/2})_{0.6}$, $(BO_{3/2})_{0.05}(TiO_{4/2})_{0.15}(HSiO_{3/2})_{0.3}((\text{tert-BuO})_2SiO_{2/2})_{0.6}$, $(BO_{3/2})_{0.05}((TiO_{4/2})_{0.05}(HSiO_{3/2})_{0.3}((\text{iso-PrO})_2SiO_{2/2})_{0.6}$, $(AlO_{3/2})_{0.15}(TiO_{4/2})_{0.15}(\text{iso-PrO}SiO_{3/2})_{0.7}$, $(AlO_{3/2})_{0.15}(TiO_{4/2})_{0.15}(\text{sec-BuO}SiO_{3/2})_{0.7}$, $(AlO_{3/2})_{0.15}(TiO_{4/2})_{0.15}(\text{tert-BuO}SiO_{3/2})_{0.7}$, $(AlO_{3/2})_{0.05}(TiO_{4/2})_{0.05}(HSiO_{3/2})_{0.3}(\text{iso-PrO}SiO_{3/2})_{0.6}$, $(AlO_{3/2})_{0.05}(TiO_{4/2})_{0.5}(HSiO_{3/2})_{0.3}(\text{tert-BuO}SiO_{3/2})_{0.6}$, $(AlO_{3/2})_{0.05}(TiO_{4/2})_{0.05}(HSiO_{3/2})_{0.3}((\text{sec-BuO})_2SiO_{2/2})_{0.6}$, $(AlO_{3/2})_{0.05}(TiO_{4/2})_{0.05}(HSiO_{3/2})_{0.3}(\text{iso-PrO})_2SiO_{2/2})_{0.6}$, $(BO_{3/2})_{0.1}(AlO_{3/2})_{0.1}(TiO_{4/2})_{0.1}(\text{iso-PrO}SiO_{3/2})_{0.7}$, $(BO_{3/2})_{0.1}(AlO_{3/2})_{0.1}(TiO_{4/2})_{0.1}(\text{sec-BuO}SiO_{3/2})_{0.7}$, $(BO_{3/2})_{0.1}(AlO_{3/2})_{0.1}(TiO_{4/2})_{0.1}(\text{tert-BuO}SiO_{3/2})_{0.7}$, $(BO_{3/2})_{0.05}(AlO_{3/2})_{0.05}(TiO_{4/2})_{0.05}(HSiO_{3/2})_{0.25}(\text{iso-PrO}SiO_{3/2})_{0.6}$, $(BO_{3/2})_{0.05}(AlO_{3/2})_{0.05}(TiO_{4/2})_{0.05}(HSiO_{3/2})_{0.25}(\text{tert-BuO}SiO_{3/2})_{0.6}$, $(BO_{3/2})_{0.05}(AlO_{3/2})_{0.05}(TiO_{4/2})_{0.05}(HSiO_{3/2})_{0.25}((\text{sec-BuO})_2SiO_{2/2})_{0.6}$, and $(BO_{3/2})_{0.05}(AlO_{3/2})_{0.05}(TiO_{4/2})_{0.05}(HSiO_{3/2})_{0.25}((\text{iso-PrO})_2SiO_{2/2})_{0.6}$, wherein iso-Pr is isopropyl, sec-Bu is secondary butyl, tert-Bu is tertiary butyl, and the numerical subscripts outside the parenthesis denote mole fractions. Also, in the preceding formulae, the sequence of units is unspecified.

The silicone resin of the present invention can be prepared by (i) reacting (a) at least one alkoxy compound having the formula $E(OR)_m$, (b) at least one silane having the formula $HSiX_3$, and (c) at least one silane having the formula $(R^1O)_nSiX_{4-n}$, with water in the presence of an organic solvent to form a hydrolyzate, wherein R is $C_1$ to $C_8$ hydrocarbyl, E is an atom selected from B, Al, and Ti, m=3 when E is B or Al, or m=4 when E is Ti, X is —OH or a hydrolyzable group, $R^1$ is $C_1$ to $C_{10}$ branched alkyl, and n is 0, 1, 2, or 3, provided —X in both silane (b) and silane (c) is more reactive with water than —$OR^1$ in silane (c); and (ii) distilling the hydrolyzate to remove water.

In step (i) of the method of preparing the silicone resin, (a) at least one alkoxy compound having the formula $E(OR)_m$, (b) at least one silane having the formula $HSiX_3$, and (c) at least one silane having the formula $(R^1O)_nSiX_{4-n}$, are reacted with water in the presence of an organic solvent to form a hydrolyzate, wherein R is $C_1$ to $C_8$ hydrocarbyl, E is an atom selected from B, Al, and Ti, m=3 when E is B or Al, or m=4 when E is Ti, X is —OH or a hydrolyzable group, $R^1$ is $C_1$ to $C_{10}$ branched alkyl, and n is 0, 1, 2, or 3, provided —X in both silane (b) and silane (c) is more reactive with water than —$OR^1$ in silane (c).

Alkoxy compound (a) is at least one alkoxy compound having the formula $E(OR)_m$, wherein R is $C_1$ to $C_8$ hydrocarbyl, E is an atom selected from B, Al, and Ti, and m=3 when E is B or Al, or m=4 when E is Ti.

The hydrocarbyl groups represented by R typically have from 1 to 8 carbon atoms, alternatively from 3 to 6 carbon atoms. Acyclic hydrocarbyl groups containing at least 3 carbon atoms can have a branched or unbranched structure. Examples of hydrocarbyl groups represented by R include, but are not limited to, unbranched and branched alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, and octyl; cycloalkyl, such as cyclopentyl, cyclohexyl, and methylcyclohexyl; phenyl; alkaryl, such as tolyl and xylyl; aralkyl, such as benzyl and phenethyl; alkenyl, such as vinyl, allyl, and propenyl; arylalkenyl, such as styryl; and alkynyl, such as ethynyl and propynyl.

Examples of alkoxy compounds suitable for use as alkoxy compound (a) include, but are not limited to, trimethyl borate, triethyl borate, tripropyl borate, triisopropyl borate, tri-tertbutyl borate, aluminum trimethoxide, aluminum triethoxide, aluminum triisopropoxide, aluminum tributoxide, aluminum tri-sec-butoxide, aluminum tri-tert-butoxide, titanium(IV) methoxide, titanium(IV) ethoxide, titanium(IV) propoxide, titanium(IV) isopropoxide, and titanium(IV) tert-butoxide.

Alkoxy compound (a) can be a single alkoxy compound or a mixture comprising two or more different alkoxy compounds, each having the formula $E(OR)_m$, wherein R, E and m are as described an exemplified above.

Methods of preparing alkoxy boron, alkoxy aluminum, and alkoxy titanium compounds are well known in the art; many of these compounds are commercially available.

Silane (b) is at least one silane having the formula $HSiX_3$, wherein X is —H or a hydrolyzable group, provided —X is more reactive with water than —$OR^1$ in silane (c). As used herein the term "hydrolyzable group" means the silicon-bonded group reacts with water in the absence of a catalyst at any temperature from room temperature (~23±2° C.) to 100° C. within several minutes, for example thirty minutes, to form a silanol (Si—OH) group. Examples of hydrolyzable groups represented by X include, but are not limited to, —Cl, —Br, —OR, —OCH$_2$CH$_2$OR, CH$_3$C(=O)O—, Et(Me)C=N—O—, CH$_3$C(=O)N(CH$_3$)—, and —ONH$_2$, wherein R is $C_1$ to $C_8$ hydrocarbyl.

Examples of silanes suitable for use as silane (b) include, but are not limited to, trimethoxysilane, triethoxysilane, tri-n-propoxysilane and tri-1-propoxysilane.

Silane (b) can be a single silane or a mixture comprising two or more different silanes, each having the formula $HSiX_3$, wherein X is as defined and exemplified above. Also, methods of preparing silanes containing hydrolyzable groups are well known in the art; many of these compounds are commercially available.

Silane (c) is at least one silane having the formula $(R^1O)_n SiX_{4-n}$, wherein $R^1$ is $C_1$ to $C_{10}$ branched alkyl, X is —H or a hydrolysable group, and n is 0, 1, 2, or 3, provided —X is more reactive with water than $OR^1$ in the silane.

Examples of silanes suitable for use as silane (c) include, but are not limited to, iso-propoxytrimethoxysilane, iso-propoxytriethoxysilane, iso-propoxytriacetoxysilane, sec-butoxytriethoxysilane, sec-butoxytriaminosilane, sec-butoxytriacetoxysilane, tert-butoxytrihydroxysilane, tert-butoxytrimethoxysilane, tert-butoxytriethoxysilane, tert-butoxytriacetoxysilane, di-isopropoxydimethoxysilane, di-isopropoxydiethoxysilane, di-isopropoxydiacetoxysilane, di-sec-butoxydimethoxysilane, di-sec-butoxydiethoxysilane, di-sec-butoxydiacetoxysilane, di-tert-butoxydihydroxysilane, di-tert-butoxydimethoxysilane, di-tert-butoxydiethoxysilane, di-tert-butoxydiacetoxysilane, tri-isopropoxymethoxysilane, tri-isopropoxyethoxysilane, tri-isopropoxyacetoxysilane, tri-sec-butoxymethoxysilane, tri-sec-butoxyethoxysilane, tri-sec-butoxyacetoxysilane, tri-tert-butoxyhydroxysilane, tri-tert-butoxymethoxysilane, tri-tert-butoxyethoxysilane, and tri-tert-butoxyacetoxysilane.

Silane (c) can be a single silane or a mixture comprising two or more different silanes, each having the formula $(R^1O)_n SiX_{4-n}$, wherein $R^1$, X, and n are as described and exemplified above. Further, methods of preparing silanes containing hydrolyzable groups are well known in the art; many of these compounds are commercially available.

The organic solvent is at least one organic solvent. The organic solvent can be any aprotic or dipolar aprotic organic solvent that is partially miscible or immiscible with water, does not react with alkoxy compound (a), silane (b), silane (c), or the silicone resin under the conditions of the present method, and is miscible with alkoxy compound (a), silane (b), silane (c), and the silicone resin. As used herein, the term "partially miscible" means that the solubility of water in the solvent is less than about 0.1 g/100 g of solvent at 25° C. Preferably, the organic solvent forms a minimum boiling azeotrope with water. If the organic solvent does not form an azeotrope with water, the organic solvent preferably has a boiling point greater than the boiling point of water. Otherwise, the organic solvent may be completely removed before water during distillation step (ii) of the method.

Examples of organic solvents include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. The organic solvent can be a single organic solvent or a mixture comprising two or more different organic solvents, each as defined above.

The method of preparing the silicone resin can be carried out in any standard reactor suitable for contacting organohalosilanes with water. Suitable reactors include glass and Teflon-lined glass reactors. Preferably, the reactor is equipped with a means of agitation, such as stirring.

Alkoxy compound (a), silane (b), silane (c), the organic solvent, and water are typically combined by adding the water to a mixture of components (a), (b), (c) and the organic solvent. Reverse addition, i.e., addition of the alkoxy compound (a), silane (b), and silane (c) to water is also possible. However, reverse addition may result in formation of a gel.

The rate of addition of water to alkoxy compound (a), silane (b), and silane (c) is typically from 1 to 100 mL/min. for a 1000-mL reaction vessel equipped with an efficient means of stirring. When the rate of addition is too slow, the reaction time is unnecessarily prolonged. When the rate of addition is too fast, the reaction mixture may form a gel.

The reaction of alkoxy compound (a), silane (b), and silane (c) with water is typically carried out at a temperature of from 20 to 150° C., alternatively from 20 to 100° C. When the silicon-bonded hydrolyzable group —X in silane (b) and/or silane (c) is an acyloxy group such as acetoxy, the reaction is typically carried out at a temperature less than 50° C.

The reaction time depends on several factors, including the structures of alkoxy compound (a), silane (b), and silane (c), and the temperature. The reaction is typically carried out for an amount of time sufficient to complete hydrolysis of the alkoxy compound, silane (a), and silane (b). As used herein, the term "to complete hydrolysis" means that at least 85 mol % of the silicon-bonded groups —OR and —X originally present in alkoxy compound (a), silane (b), and silane (c) are converted to silicon-bonded hydroxy groups. For example, the reaction time is typically from 5 to 180 min., alternatively from 10 to 60 min., alternatively from 15 to 25 min., at a temperature of from 20 to 60° C. The optimum reaction time can be determined by routine experimentation using the methods set forth in the Examples section below.

The concentration of alkoxy compound (a) is typically from 1 to 80 mol %, alternatively from 10 to 40 mol %, alternatively from 5 to 15 mol %, based on the sum of the number of moles of components (a), (b), and (c).

The concentration of the organic solvent is typically from 30 to 99% (w/w), alternatively from 45 to 90% (w/w), alternatively from 40 to 80% (w/w), based on the total weight of the reaction mixture.

The concentration of water in the reaction mixture is typically sufficient to effect hydrolysis of the alkoxy compound (a), silane (b), and silane (c). For example, the concentration of water is typically such that the ratio of the number of moles of water to the sum of the number of moles of the silicon-bonded groups —OR and —X in alkoxy compound (a), silane (b), and silane (c) is from 0.5 to 2, alternatively from 0.8 to 1.2.

In step (ii) of the method of preparing the silicone resin, the hydrolyzate is distilled to remove water. The distillation can be carried out at atmospheric or subatmospheric pressure. When the solvent forms a minimum boiling azeotrope with water, the distillation can be conveniently carried out using a Dean-Stark trap, which collects water and returns solvent to the distillation vessel. The distillation is typically carried out at a temperature of from 80 to 110° C., alternatively from 90 to 110° C., at 100 kPa. The distillation is typically continued for an amount of time sufficient to produce a silicone resin having a weight-average molecular weight of from 500 to 150,000.

When the silicon-bonded hydrolyzable group —X in silane (b) and/or silane (c) is an acyloxy group, such as acetoxy, an acid (e.g., acetic acid), which may adversely affect the stability of the silicone resin product, is produced as a by-product in the hydrolysis reaction of step (i). In this case, the acid in the hydrolyzate is typically neutralized or removed before the hydrolyzate is distilled to remove water in step (ii). The acid can be neutralized by treating the hydrolyzate with a neutralizing agent. Examples of suitable neutralizing agents include, but are not limited to, inorganic bases such as calcium carbonate, sodium carbonate, sodium bicarbonate, ammonium carbonate, ammonia, calcium oxide, and calcium hydroxide. Alternatively, the acid can be removed, often as an azeotrope with solvent, by distilling the hydrolyzate.

The silicone resin can be used without further isolation or purification or the resin can be separated from most of the solvent by conventional methods of evaporation. For example, the distilled hydrolyzate can be heated under reduced pressure.

A silicone composition according to the present invention comprises:

(A) a silicone resin having the formula $(EO_{s/2})_t(HSiO_{3/2})_v((R^1O)_3SiO_{1/2}))_w((R^1O)_2SiO_{2/2}))_x(R^1OSiO_{3/2})_y(SiO_{4/2})_z$ (I), wherein each E is independently an atom selected from B, Al, and Ti; $R^1$ is $C_1$ to $C_{10}$ branched alkyl; s=3 when E is B or Al, or s=4 when E is Ti; t is from 0.01 to 0.8; v is from 0 to 0.99; w is from 0 to 0.99; x is from 0 to 0.99; y is from 0 to 0.99; z is from 0 to 0.8; w+x+y=0.01 to 0.99; and t+v+w+x+y+z=1; and (B) an organic solvent.

Components (A) is the silicone resin having the formula (I), described and exemplified above. Component (A) can be a single silicone resin or a mixture comprising two or more different silicone resins, each having the formula (I).

Component (B) is at least one organic solvent. The organic solvent can be any protic, aprotic, or dipolar aprotic organic solvent that does not react with the silicone resin and is miscible with the silicone resin.

Examples of organic solvents include, but are not limited to, alcohols, such as methanol, ethanol, 1-propanol, 2-propanol, 1-butanol, 2-butanol, 2-methyl-1-butanol, 1-pentanol, and cyclohexanol; saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. The organic solvent can be a single organic solvent or a mixture comprising two or more different organic solvents, each as defined above.

The concentration of the organic solvent is typically from 20 to 95% (w/w), alternatively from 50 to 90% (w/w), alternatively from 70 to 80% (w/w), based on the total weight of the silicone composition.

The silicone composition can further comprise a hydrogen silsesquioxane resin. The hydrogen silsesquioxane resin (H-resin) may be represented by the general formula $HSi(OH)_a(OR')_bO_{c/2}$, wherein each R' is independently a hydrocarbyl group which, when bonded to silicon through the oxygen atom, forms a hydrolyzable substituent, a=0 to 2, b=0 to 2, c=1 to 3, and a+b+c=3. Examples of hydrocarbyl groups include alkyl such as methyl, ethyl, propyl, and butyl; aryl such as phenyl; and alkenyl such as allyl and vinyl. These resins may be fully condensed $(HSiO_{3/2})_n$ or partially hydrolyzed (i.e., containing some Si—OR' groups) and/or partially condensed (i.e., containing some Si—OH groups). Although not represented by the formula above, the resin may contain a small number (e.g., less than about 10%) of silicon atoms to which are bonded either 0 or 2 hydrogen atoms.

The hydrogen silsesquioxane resin can be a single hydrogen silsesquioxane resin or a mixture comprising two or more different hydrogen silsesquioxane resins, each as described above.

When present, the concentration of the hydrogen silsesquioxane resin in the silicone composition is typically from 1 to 99% (w/w), alternatively from 2 to 60% (w/w), alternatively from 5 to 40% (w/w), based on the total weight of the silicone composition.

Methods of preparing H-resins are well known in the art as exemplified in U.S. Pat. No. 3,615,272 to Collins et al.; U.S. Pat. No. 5,010,159 to Bank et al.; U.S. Pat. No. 4,999,397 to Frye et al.; U.S. Pat. No. 5,063,267 to Hanneman et al.; U.S. Pat. No. 4,999,397 to Frye et al.; Kokai Patent No. 59-178749; Kokai Patent No. 60-86017; and Kokai Patent No. 63-107122.

A coated substrate according to the present invention comprises:

a substrate; and a coating on the substrate, wherein the coating is a pyrolyzed product of a silicone resin having the formula $(EO_{s/2})_t(HSiO_{3/2})_v((R^1O)_3SiO_{2/2}))_w((R^1O)_2SiO_{2/2}))_x(R^1OSiO_{3/2})_y(SiO_{4/2})_z$ (I), wherein each E is independently an atom selected from B, Al, and Ti; $R^1$ is $C_1$ to $C_{10}$ branched alkyl; s=3 when E is B or Al, or s=4 when E is Ti; t is from 0.01 to 0.8; v is from 0 to 0.99; w is from 0 to 0.99; x is from 0 to 0.99; y is from 0 to 0.99; z is from 0 to 0.8; w+x+y=0.01 to 0.99; and t+v+w+x+y+z=1.

The substrate can be any rigid or flexible material having a planar, complex, or irregular contour. The substrate can be transparent or nontransparent to light in the visible region (~400 to ~700 nm) of the electromagnetic spectrum. Also, the substrate can be an electrical conductor, semiconductor, or nonconductor. Moreover, the substrate can be an electronic device, such as a discrete device and an integrated circuit.

Examples of substrates include, but are not limited to, semiconductors such as silicon, silicon having a surface layer of silicon dioxide, silicon carbide, indium phosphide, and gallium arsenide; quartz; fused quartz; aluminum oxide; ceramics; glass; metal foils; polyolefins such as polyethylene, polypropylene, polystyrene, polyethylene terephthalate (PET), and polyethylene naphthalate; fluorocarbon polymers such as polytetrafluoroethylene and polyvinylfluoride; polyamides such as Nylon; polyimides; polyesters such as poly (methyl methacrylate); epoxy resins; polyethers; polycarbonates; polysulfones; and polyether sulfones.

Examples of discrete devices include, but are not limited to, diodes, such as PIN diodes, voltage reference diodes, varactor diodes, Avalanche diodes, DIACs, Gunn diodes, Snap diodes, IMPATT diodes, tunnel diodes, Zener diodes, normal (p-n) diodes, and Shottky diodes; transistors, such as bipolar transistors, including, insulated gate bipolar transistors (IGBTs) and Darlington transistors, and field-effect transistors (FETs), including metal oxide semiconductor FETs (MOSFETs), junction FETs (JFETs), metal-semiconductor FETs (MESFETs), organic FETs, high electron mobility transistors (HEMTs), and thin film transistors (WFIs), including organic field effect transistors; thyristors, for example, DIACs, TRIACs, silicon controlled rectifiers (SCRs), distributed buffer-gate turn-off (DB-GTO) thyristors, gate turn-off (GTO) thyristors, MOFSET controlled thyristors (MCTs), modified anode-gate turn-off (MA-GTO) thyristors, static induction thyristors (SIThs), and field controlled thyristors (FCThs); varistors; resistors; condensers; capacitors; thermistors; and optoelectronic devices, such as photodiodes, solar cells (for example CIGS solar cells and organic photovoltaic cells), phototransistors, photomultipliers, integrated optical circuit (IOC) elements, light-dependent resistors, laser diodes, light-emitting diodes (LEDs), and organic light-emitting diodes (OLEDs), including small-molecule OLEDs (SM-OLEDs) and polymer light-emitting diodes (PLEDs).

Examples of integrated circuits include, but are not limited to, monolithic integrated circuits, such as memory ICs, including RAM (random-access memory), including DRAM and SRAM, and ROM (read-only memory); logic circuits; analog integrated circuits; hybrid integrated circuits, including thin-film hybrid ICs and thick-film hybrid ICs; thin film batteries; and fuel cells.

The coating on the substrate is a pyrolyzed product of a silicone resin having the formula $(EO_{s/2})_t(HSiO_{3/2})_v((R^1O)_3SiO_{2/2}))_w((R^1O)_2SiO_{2/2}))_x(R^1OSiO_{3/2})_y(SiO_{4/2})_z$ (I), wherein E, $R^1$ s, t, v, w, x, y, z, w+x+y, and t+v+w+x+y+z are as defined and exemplified above.

As used herein, the term "pyrolyzed product of a silicone resin" refers to a silicate glass containing at least one of boron, aluminum, and titanium.

The coating of the coated substrate typically has a thickness of from 0.1 to 5 µm, alternatively from 0.2 to 3 µm, alternatively from 0.25 to 2 µm.

The coating typically has a dielectric constant of from 2.5 to 3.4, alternatively from 2.6 to 3. Also, the coating typically has a Young's modulus of from 7 to 20 GPa, alternatively from 7 to 15 GPa. Further, the coating typically has a refractive index of from 1.30 to 1.50, alternatively from 1.35 to 1.47, for light having a wavelength of 632.8 nm.

The coated substrate can be prepared by applying a silicone composition, described above, comprising the silicone resin of the present invention and an organic solvent on a substrate to form a film, and pyrolyzing the silicone resin of the film.

The silicone composition, described above, can be applied on the substrate using conventional methods such as spin coating, dip coating, spray coating, flow coating, screen printing, and roll coating. When present, the solvent is typically allowed to evaporate from the coated substrate before the film is heated. Any suitable means for evaporation may be used such as simple air drying, applying a vacuum, or heating (up to about 50° C.).

The silicone resin can be pyrolyzed by heating the film in an atmosphere of air or an inert gas, such a nitrogen, helium, or argon, at a temperature of from 350 to 1000° C., alternatively from 350 to 800° C., alternatively from 400 to 700° C. The film can be heated at atmospheric, subatmospheric, or supraatmospheric pressure. The film can be heated using conventional equipment, such as quartz tube furnaces, convection ovens, and radiant energy systems (e.g., microwave ovens). The film is typically heated for a period of time such that the pyrolyzed product has a Young's modulus at 25° C. of at least 5 GPa. For example, the film is typically heated for a period of from 0.1 to 3 h, alternatively from 0.5 to 1.5 h.

Alternatively, the silicone resin of the film can be pyrolyzed by first curing (i.e., cross-linking) the silicone resin of the film and then heating the cured silicone resin at a temperature of from 350 to 800° C. The silicone resin can be cured by heating the film at a temperature of from 50 to 260° C., alternatively from 50 to 250° C., alternatively from 100 to 200° C.

The method of the present invention can further comprise forming a coating on at least a portion of the coating comprising a pyrolyzed product of the silicone resin. Examples of coatings include, but are not limited to, inorganic oxides, such as indium tin oxide, silicon dioxide, and titanium dioxide; inorganic nitrides, such as silicon nitride and gallium nitride; inorganic carbides, such as silicon carbide and hydrogenated silicon oxycarbide; metals, such as copper, silver, gold, nickel, and chromium; and silicon, such as amorphous silicon, microcrystalline silicon, and polycrystalline silicon. Methods of forming inorganic coatings, such as physical vapor deposition and chemical vapor deposition, are well known in the art.

The silicone resin of the present invention is soluble in a variety of organic solvents and is substantially free of gel. Moreover, the silicone resin can be pyrolyzed to produce silicate coatings exhibiting good adhesion to a variety of substrates.

The silicone composition of the present invention can be conveniently formulated as a one-part composition having good shelf-stability. Moreover, the composition can be applied on a substrate by conventional high-speed methods such as spin coating, dip-coating, printing, and spraying.

The method of preparing the coated substrate can be carried out using conventional equipment and techniques. Also, the method can be scaled to a commercial manufacturing process.

The silicone resin of the present invention can be used to prepare protective or dielectric coatings that are useful in a variety of consumer devices, including semiconductor devices, liquid crystals, light-emitting diodes, organic light-emitting diodes, optoelectronic devices, optical devices, photovoltaic cells, thin film batteries, and solar cells.

EXAMPLES

The following examples are presented to better illustrate the silicone resin, silicone composition, and method of the present invention, but are not to be considered as limiting the invention, which is delineated in the appended claims. Unless otherwise noted, all parts and percentages reported in the examples are by weight. The following methods and materials were employed in the examples:

Molecular Weights

Number-average and weight-average molecular weights ($M_n$ and $M_w$) of silicone resins were determined by gel permeation chromatography (GPC) using a PLgel (Polymer Laboratories, Inc.) 5-µm column at room temperature (~23° C.), a THF mobile phase at 1 mL/min, and a refractive index detector. Polystyrene standards were used for linear regression calibrations.

Infrared Spectra

Infrared spectra of coated silicon wafers were recorded on a Perkin Elmer Instruments 1600 FT-IR spectrometer.

Refractive Index and Thickness

Refractive Index (RI) and thickness of coatings on silicon wafers were measured using a Woollam M-88 Spectroscopic Ellipsometer equipped with WVASE32 software for data analysis. The refractive index was determined at 20° C. for light having a wavelength of 632.8 nm. The reported for refractive index and thickness each represent the average of three measurements performed on different regions of the same coated wafer.

Dielectric Constant

Dielectric constants of coatings were determined from capacitance measurements performed on metal-insulator-semiconductor (MIS) capacitors using a HP4194A Impedance/Gain-Phase Analyzer. Circular aluminum electrodes were deposited by evaporation onto the coatings. A series capacitance was measured through the wafer using a pair of electrodes having the same diameter. Capacitance measurements were taken over a frequency range of $10^2$-$10^7$ Hz using three pairs of electrodes of different diameter (0.12 in., 0.191 in., and 0.252 in.). The dielectric constants reported were derived from measurements performed at $10^6$ Hz. Reported values for dielectric constant, $D_k$, represent the average of three measurements using electrodes of different diameter.

Reduced Modulus and Hardness

Reduced modulus and hardness of coatings on silicon wafers were measured at room temperature (~23±2° C.) using a Hysitron Triboscope® nanomechanical testing instrument equipped with a Berkovich diamond indenter. Hardness and reduced modulus values were determined at a penetration depth of approximately 15%. Reduced modulus can be calculated using the equation:

$$E_R = E/(1-v^2)$$

where:
$E_R$ is reduced modulus, GPa,
E is Young's modulus, GPa, and
v is Poisson's ratio.

Young's modulus was determined from the slope of the load displacement curve. The reported values for reduced modulus and hardness each represent the average of three measurements performed on different regions of the same coated wafer.

Triethoxysilane was obtained from Gelest (Morrisville, Pa.).

Trimethyl borate (≧90%) was obtained from Aldrich (St. Louis, Mo.).

Tetra-t-butoxytitanium was obtained from Dow Corning Corporation (Midland, Mich.).

Di-t-butoxydiacetoxysilane was obtained from Gelest (Morrisville, Pa.).

Fox®-17 Flowable Oxide, which is sold by Dow Corning Corporation (Midland, Mich.), is a solution containing 26% (w/w) of a hydrogen silsesquioxane resin in methyl isobutyl ketone.

Example 1

Triethoxysilane (45.0 g), 14.2 grams of trimethyl borate, 280.0 g of di-t-butoxydiacetoxysilane, and 440.6 g of tetrahydrofuran were combined under argon in a two liter flask. Water (53.4 g) was added to the mixture during a period of 14 min. The mixture was stirred at room temperature for 1 h and then diluted with 400.3 g of toluene. The mixture was concentrated under reduced pressure at 33° C. using a rotary-evaporator. The residue was treated with 500.6 g of toluene and the mixture was again concentrated under reduced pressure at 33° C. using a rotary-evaporator. Finally, the residue was treated with 720.7 g of toluene and the mixture was transferred to a flask equipped with a Dean-Stark Trap and thermometer. The mixture was distilled to remove any residual acetic acid as an azeotrope with toluene. After removing 214 g of volatile material, the hydrolyzate was distilled for 1 h to remove water. During this period, solvent was allowed to return to the distilling flask. The cooled solution was filtered and concentrated under reduced pressure at 33° C. using a rotary-evaporator. The residue was further concentrated at 25° C. under high vacuum (1 mm Hg) to give 148 g of a silicone resin.

Example 2

Triethoxysilane (33.7 g), 7.3 g of trimethyl borate, 120.6 g of di-t-butoxydiacetoxysilane, and 220.6 g of tetrahydrofuran were combined under argon in a two liter flask. Water (26.6 g) was added to the mixture during a period of 14 min. The mixture was stirred at room temperature for 1 h and then diluted with 200.5 g of toluene. The mixture was concentrated under reduced pressure at 33° C. using a rotary-evaporator. The residue was treated with 250.4 g of toluene and the mixture was again concentrated under reduced pressure at 33° C. using a rotary-evaporator. Finally, the residue was treated with 360 g of toluene and the mixture was transferred to a flask equipped with a Dean-Stark Trap and thermometer. The mixture was distilled to remove any residual acetic acid as an azeotrope with toluene. After removing 214 g of volatile material, the hydrolyzate was distilled for 1 h to remove water. During this period, solvent was allowed to return to the distilling flask. The cooled solution was filtered and concentrated under reduced pressure at 33° C. using a rotary-evaporator. The residue was further concentrated at 25° C. under high vacuum (1 mm Hg) to give 72.3 g of a silicone resin.

Example 3

Di-t-butoxydiacetoxysilane (40.0 g) was combined with 120.0 grams of tetrahydrofuran in a one liter flask. Water (4.9 g) was slowly added dropwise to the solution. The mixture was stirred at room temperature for 30 min. Tetra-t-butoxytitanium (20.0 g) was slowly added to the mixture. The reaction mixture was stirred for 1 h at room temperature and then diluted with 100 g of toluene. The mixture was concentrated under reduced pressure at 25 to 35° C. using a rotary-evaporator. The residue was treated with 200.6 g of toluene and the mixture was again concentrated under reduced pressure at 33° C. using a rotary-evaporator. Finally, the residue was treated with 140 g of toluene and the mixture was transferred to a flask equipped with a Dean-Stark Trap and thermometer. The mixture was distilled to remove any residual acetic acid as an azeotrope with toluene. After removing 22 g of volatile material, the hydrolyzate was distilled for 1 h to remove water. During this period, solvent was allowed to return to the distilling flask. The cooled solution was filtered and concentrated under reduced pressure at 33° C. using a rotary-evaporator. The residue was further concentrated at 25° C. under high vacuum (1 mm Hg) to give 30 g of a silicone resin having a weight-average molecular weight of 1550 and a number-average molecular weight of 979.

Example 4

Di-t-butoxydiacetoxysilane (40.0 g) was combined with 120.0 grams of tetrahydrofuran in a one liter flask. Water (7.7 g) was slowly added dropwise to the solution. The mixture was stirred at room temperature for 20 min. Tetra-t-butoxytitanium (46.7 g) was added to the mixture during a period of 10 min. The reaction mixture was stirred for 1 h at room temperature and then diluted with 100 g of toluene. The mixture was concentrated under reduced pressure at 25 to 35° C. using a rotary-evaporator. The residue was treated with 200 g of toluene and the mixture was again concentrated under reduced pressure at 33° C. using a rotary-evaporator. Finally, the residue was treated with 140 g of toluene and the mixture was transferred to a flask equipped with a Dean-Stark Trap and thermometer. After removing 22 g of volatile material, the hydrolyzate was distilled for 1 h to remove water. During this period, solvent was allowed to return to the distilling flask. The cooled solution was filtered and concentrated under reduced pressure at 33° C. using a rotary-evaporator. The residue was further concentrated at 25° C. under high vacuum (1 mm Hg) to give 51 g of a silicone resin having a weight-average molecular weight of 1500 and a number-average molecular weight of 1120.

Example 5

Trimethyl borate (6.0 g) and 150.2 g of di-t-butoxydiacetoxysilane, and 260.4 g of tetrahydrofuran were combined under argon in a two liter flask. Water (20.2 g) was added dropwise to the mixture. The mixture was stirred at room temperature for 1 h and then diluted with 200.3 g of toluene. The mixture was concentrated under reduced pressure at 33° C. using a rotary-evaporator. The residue was treated with 250.1 g of toluene and the mixture was again concentrated under reduced pressure at 33° C. using a rotary-evaporator. Finally, the residue was treated with 209.9 g of toluene and the mixture was transferred to a flask equipped with a Dean-Stark Trap and thermometer. The hydrolyzate was distilled for 1 h to remove water. During this period, solvent was allowed to return to the distilling flask. The cooled solution was filtered and concentrated under reduced pressure at 33° C. using a rotary-evaporator. The residue was further concentrated at 25° C. under high vacuum (1 mm Hg) to give 67.7 g of a silicone resin having a weight-average molecular weight of 12100 and a number-average molecular weight of 5140.

Example 6

A solution containing 25% (w/w) of the silicone resin of Example 2 in methyl isobutyl ketone was filtered through a 1.0 μm and a 0.2 μm syringe membrane filter combination. The solution was spin-coated (2000 rpm, 20 s) on a 150-mm single crystal silicon wafer. The coated silicon wafer was placed in a quartz tube furnace in a nitrogen atmosphere (flow rate=20 L/min.). The furnace was heated to 700° C. at a rate of 25° C./min., held at 700° C. for 30 min., and then allowed to cool to room temperature while maintaining the nitrogen flow. The coating had a thickness of 3982□, a refractive index of 1.3788, a modulus of 12.9 GPa, and a dielectric constant ($D_k$) at 1 MHz of 4.46. The FT-IR spectrum of the coating showed $SiO_2$ containing a trace amount of Si—H and 4.43 mol % of Si—OH, based on the total number of moles of Si—O bonds in the coating.

Example 7

A solution containing 25% (w/w) of the silicone resin of Example 2 in methyl isobutyl ketone was filtered through a 1.0 μm and a 0.2 μm syringe membrane filter combination. The solution was spin-coated (1000 rpm, 20 s) on a 150-mm single crystal silicon wafer. The coated silicon wafer was placed in a quartz tube furnace and the oven was purged with nitrogen (flow rate=20 L/min.). The nitrogen was replaced with oxygen gas having a flow rate of 10 L/min. The furnace was heated to 680° C. at a rate of 25° C./min. When the temperature reached 680° C., the rate of heating was reduced to 4° C./min. and steam was introduced into the oven at a rate of 24 g/min. The furnace was held at 700° C. for 30 min. while maintaining the flow of oxygen and steam. The oxygen and steam were then discontinued and nitrogen was introduced into the oven at a flow rate of 20 L/min. The oven was cooled to room temperature at a rate of 25° C./min. The coating had a thickness of 3180□, a refractive index of 1.390, a modulus of 36.6 GPa, and a hardness of 2.67 GPa. The FT-IR spectrum of the coating showed no residual Si—H and 1.6 mol % of Si—OH, based on the total number of moles of Si—O bonds in the coating.

Example 8

A solution (15.5 g) containing 25% (w/w) of the silicone resin of Example 2 in methyl isobutyl ketone was combined with 84.5 g of Fox®-17 Flowable Oxide. The resulting solution was spin-coated on a 150-mm single crystal silicon wafer to achieve a film thickness of 1 μm after heating. The coated wafer was heated for 1 min. on each of three hot plates at 150° C., 200° C. and 350° C. The coated silicon wafer was then placed in a quartz tube furnace in a nitrogen atmosphere (flow rate=20 L/min.). The furnace was heated at 400° C. for 60 min., and then allowed to cool to room temperature while maintaining the nitrogen flow. The mechanical properties of the coated wafer are shown in Table 1.

Example 9

A coated wafer was prepared as described in Example 8, except the final step of heating was performed at 425° C. rather than 400° C. The mechanical properties of the coated wafer are shown in Table 1.

Example 10

A solution (5 g) containing 25% (w/w) of the silicone resin of Example 2 in methyl isobutyl ketone was combined with 95 g of Fox®-17 Flowable Oxide. A coated wafer was prepared as described in Example 8. The mechanical properties of the coated wafer are shown in Table 1.

Example 11

A coated wafer was prepared as described in Example 10, except the final step of heating was performed at 425° C. rather than 400° C. The mechanical properties of the coated wafer are shown in Table 1.

Example 12

A solution (5 g) containing 25% (w/w) of the silicone resin of Example 1 in methyl isobutyl ketone was combined with 95 g of Fox®-17 Flowable Oxide. A coated wafer was prepared as described in Example 8. The mechanical properties of the coated wafer are shown in Table 1.

Comparative Example 1

A coated wafer was prepared as described in Examples 8, except the solution containing the silicone resin of Example 2 and Fox®-17 Flowable Oxide was replaced with Fox®-17 Flowable Oxide. The mechanical properties of the coated wafer are shown in Table 1.

Comparative Example 2

A coated wafer was prepared as described in Comparative Example 1, except the final step of heating was performed at 425° C. rather than 400° C. The mechanical properties of the coated wafer are shown in Table 1.

TABLE 1

| Example | Pyrolysis Temp (° C.) | Thickness (Å) | RI | $D_k$ | Modulus (GPa) |
|---|---|---|---|---|---|
| 8 | 400 | 9740 | 1.363 | 3.20 | 8.40 |
| 9 | 425 | 9525 | 1.375 | 3.38 | 13.90 |
| 10 | 400 | 10060 | 1.373 | 2.93 | 8.40 |
| 11 | 425 | 5923.4 | 1.375 | 3.34 | 9.35 |
| 12 | 400 | 9750 | 1.379 | 2.86 | 7.50 |
| Comp. 1 | 400 | 9991 | 1.374 | 2.75 | 5.80 |
| Comp. 2 | 425 | 9745 | 1.386 | 2.74 | 6.45 |

RI refers to refractive index,
$D_k$ denotes dielectric constant, and
Modulus refers to reduced modulus.

That which is claimed is:

1. A silicone resin having the formula:

$$(EO_{s/2})_t(HSiO_{3/2})_v((R^1O)_3SiO_{1/2})_w((R^1O)_2SiO_{2/2})_x(R^1OSiO_{3/2})_y(SiO_{4/2})_z \quad (I),$$

wherein each E is independently an atom selected from B, Al, and Ti; $R^1$ is $C_1$ to $C_{10}$ branched alkyl; s=3 when E is B or Al, or s=4 when E is Ti; t is from 0.01 to 0.8; v is from 0 to 0.99; w is from 0 to 0.99; x is from 0 to 0.99; y is from 0 to 0.99; z is from 0 to 0.8; w+x+y=0.01 to 0.99; and t+v+w+x+y+z=1.

2. The silicone resin according to claim 1, wherein E is boron.

3. The silicone resin according to claim 1, wherein the silicone resin contains from 20 to 105 mol % of silicon-bonded hydroxy groups.

4. A silicone composition comprising:
(A) a silicone resin having the formula $(EO_{s/2})_t(HSiO_{3/2})_v((R^1O)_3SiO_{1/2})_w((R^1O)_2SiO_{2/2})_x(R^1OSiO_{3/2})_y(SiO_{4/2})_z$ (I), wherein each E is independently an atom selected from B, Al, and Ti; $R^1$ is $C_1$ to $C_{10}$ branched alkyl; s=3 when E is B or Al, or s=4 when E is Ti; t is from 0.01 to 0.8; v is from 0 to 0.99; w is from 0 to 0.99; x is from 0 to 0.99; y is from 0 to 0.99; z is from 0 to 0.8; w+x+y=0.01 to 0.99; and t+v+w+x+y+z=1; and
(B) an organic solvent.

5. The silicone composition according to claim 4, wherein E is boron.

6. The silicone composition according to claim 4, further comprising a hydrogen silsesquioxane resin.

7. A method of preparing a coated substrate, the method comprising:
applying a silicone composition on a substrate to form a film, wherein the silicone composition comprises (A) a silicone resin having the formula $(EO_{s/2})_t(HSiO_{3/2})_v((R^1O)_3SiO_{1/2})_w((R^1O)_2SiO_{2/2})_x(R^1OSiO_{3/2})_y(SiO_{4/2})_z$ (I), wherein each E is independently an atom selected from B, Al, and Ti; $R^1$ is $C_1$ to $C_{10}$ branched alkyl; s=3 when E is B or Al, or s=4 when E is Ti; t is from 0.01 to 0.8; v is from 0 to 0.99; w is from 0 to 0.99; x is from 0 to 0.99; y is from 0 to 0.99; z is from 0 to 0.8; w+x+y=0.01 to 0.99; and t+v+w+x+y+z=1, and (B) an organic solvent; and
pyrolyzing the silicone resin of the film.

8. The method according to claim 7, wherein E is boron.

9. The method according to claim 7, wherein the step of pyrolyzing is carried out in an atmosphere of an inert gas.

10. The method according to claim 7, wherein the step of pyrolyzing is carried out at a temperature of from 350 to 800° C.

* * * * *